(12) United States Patent
Hwang et al.

(10) Patent No.: US 9,312,429 B2
(45) Date of Patent: Apr. 12, 2016

(54) SEMICONDUCTOR LIGHT EMITTING DEVICE, SEMICONDUCTOR WAFER WITH FIRST AND SECOND PORTIONS WITH DIFFERENT LATTICE POLARITIES

(71) Applicant: Kabushiki Kaisha Toshiba, Minato-ku (JP)

(72) Inventors: Jongil Hwang, Nonoichi (JP); Rei Hashimoto, Edogawa-ku (JP); Shinji Saito, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/335,113

(22) Filed: Jul. 18, 2014

(65) Prior Publication Data

US 2015/0021546 A1   Jan. 22, 2015

(30) Foreign Application Priority Data

Jul. 19, 2013   (JP) .................................. 2013-150504

(51) Int. Cl.
| | |
|---|---|
| H01L 33/06 | (2010.01) |
| H01L 33/00 | (2010.01) |
| H01L 33/18 | (2010.01) |
| H01S 5/00 | (2006.01) |
| H01L 33/32 | (2010.01) |

(Continued)

(52) U.S. Cl.
CPC .............. *H01L 33/007* (2013.01); *H01L 33/18* (2013.01); *H01S 5/00* (2013.01); *H01L 33/32* (2013.01); *H01S 5/3202* (2013.01); *H01S 5/34333* (2013.01)

(58) Field of Classification Search
CPC ....... H01L 33/32; H01L 33/06; H01L 33/007; H01L 33/18; H01S 5/00; H01S 5/3202; H01S 5/34333
USPC ............................................... 257/13; 438/47
See application file for complete search history.

(56) References Cited

U.S. PATENT DOCUMENTS

2003/0173574 A1   9/2003   Koide et al.
2006/0257626 A1*  11/2006   Schlesser et al. ............. 428/141

(Continued)

FOREIGN PATENT DOCUMENTS

| JP | 2003-234501 | 8/2003 |
|---|---|---|
| JP | 3622562 | 2/2005 |

(Continued)

OTHER PUBLICATIONS

Ingrid L. Koslow et al. "Performance and polarization effects in (11 2-2) long wavelength light emitting diodes grown on stress relaxed InGaN buffer layers", Applied Physics Letters 101, 2012, 5 pages.

*Primary Examiner* — Peter Bradford
(74) *Attorney, Agent, or Firm* — Oblon, McClelland, Maier & Neustadt, L.L.P.

(57) ABSTRACT

According to one embodiment, a semiconductor light emitting device includes a light emitting layer and a first semiconductor layer. The first semiconductor layer is arranged with the light emitting layer in a first direction. The first semiconductor layer includes a first portion and a second portion. The first portion and a second portion include a nitride semiconductor. The first portion has a first lattice polarity. The second portion has a second lattice polarity different from the first lattice polarity.

15 Claims, 11 Drawing Sheets

(51) Int. Cl.
*H01S 5/32* (2006.01)
*H01S 5/343* (2006.01)

(56) References Cited

U.S. PATENT DOCUMENTS

2007/0281378 A1   12/2007   Kim
2009/0090917 A1   4/2009    Oshima et al.
2011/0020602 A1*  1/2011    Schlesser ............... C30B 25/02
                                                        428/141
2012/0107979 A1*  5/2012    Moon ................. H01L 33/0079
                                                        438/29
2013/0001644 A1*  1/2013    Fujikura et al. ............... 257/190
2013/0272323 A1*  10/2013   Kim et al. ....................... 372/21

FOREIGN PATENT DOCUMENTS

JP    2005-150631    6/2005
JP    4556983        10/2010

\* cited by examiner

SEMICONDUCTOR LIGHT EMITTING DEVICE, SEMICONDUCTOR WAFER WITH FIRST AND SECOND PORTIONS WITH DIFFERENT LATTICE POLARITIES

CROSS-REFERENCE TO RELATED APPLICATIONS

This application is based upon and claims the benefit of priority from Japanese Patent Application No. 2013-150504, filed on Jul. 19, 2013; the entire contents of which are incorporated herein by reference.

FIELD

Embodiments described herein relate generally to a semiconductor light emitting device, a semiconductor wafer, and a method for manufacturing semiconductor light emitting device.

BACKGROUND

There are semiconductor light emitting devices such as light emitting diodes and laser diodes. There are semiconductor wafers used in manufacturing the semiconductor light emitting devices. Improvement in luminous efficiency is desired in the semiconductor light emitting devices.

DETAILED DESCRIPTION

Figure 1A:
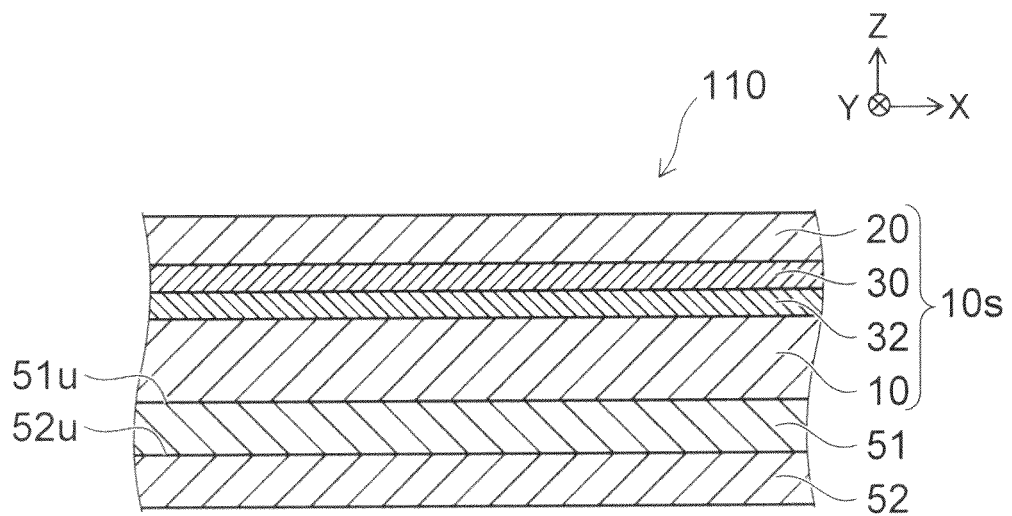
FIG. 1A and FIG. 1B are schematic views illustrating a semiconductor light emitting device according to a first embodiment.

According to one embodiment, a semiconductor light emitting device includes a light emitting layer and a first semiconductor layer. The first semiconductor layer is arranged with the light emitting layer in a first direction. The first semiconductor layer includes a first portion and a second portion. The first portion and the second portion include a nitride semiconductor. The first portion has a first lattice polarity. The second portion has a second lattice polarity different from the first lattice polarity.

According to another embodiment, a semiconductor wafer includes a substrate, a light emitting layer, and a first semiconductor layer. The light emitting layer is arranged with the substrate in a first direction. The first semiconductor layer is provided between the substrate and the light emitting layer. The first semiconductor layer includes a first portion and a second portion. The first portion and the second portion include a nitride semiconductor. The first portion has a first lattice polarity. The second portion has a second lattice polarity different from the first lattice polarity.

According to another embodiment, a method is disclosed for manufacturing a semiconductor light emitting device. The method can include forming a first semiconductor layer on a substrate by using a carrier gas including nitrogen and hydrogen. The first semiconductor layer includes a nitride semiconductor. A mixing ratio of nitrogen in the carrier gas is greater than a mixing ratio of hydrogen in the carrier gas. The method can include forming a light emitting layer on the first semiconductor layer.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and detailed descriptions of such elements are omitted as appropriate.

First Embodiment

Figure 1B:
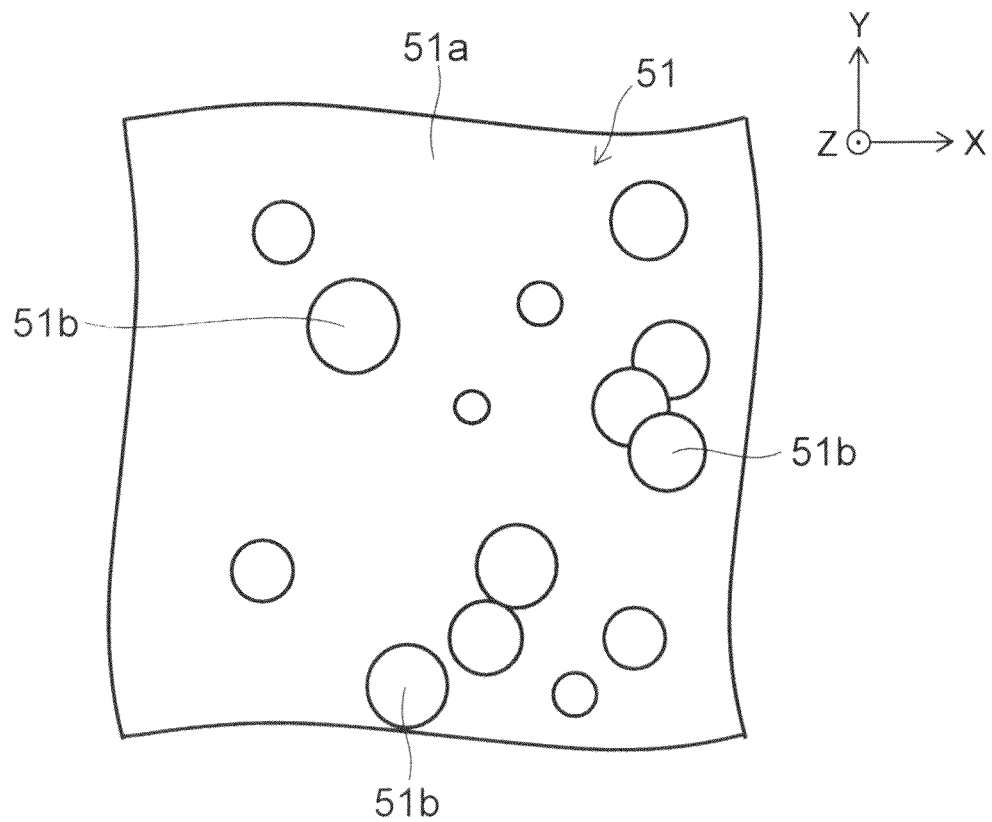

FIG. 1A and FIG. 1B are schematic views illustrating a semiconductor light emitting device according to a first embodiment.

FIG. 1A is a schematic cross-sectional view of a semiconductor light emitting device 110. FIG. 1B is a partial plan section schematically illustrating an enlarged portion of the semiconductor light emitting device 110.

As illustrated in FIG. 1A, the semiconductor light emitting device 110 includes a functional layer 10s and a first semiconductor layer 51. The first semiconductor layer 51 is arranged with the functional layer 10s in a first direction. The functional layer 10s includes a light emitting layer 30. The first semiconductor layer 51 is arranged with the light emitting layer 30 in the first direction. The semiconductor light emitting device 110 further includes a foundation layer 52. The first semiconductor layer 51 is provided in between the foundation layer 52 and the light emitting layer 30.

The foundation layer 52 includes a nitride semiconductor. That is, the foundation layer 52 is a nitride semiconductor layer including the nitride semiconductor. The foundation layer 52 has, for example, a crystal structure of a wurtzite type. The foundation layer 52 is, for example, a GaN layer. The foundation layer 52 is, for example, undoped. The foundation layer 52 may include, for example, an impurity of an n-type. The impurity of the n-type in the foundation layer 52 may use, for example, at least one of O, Si, Ge, Te, and Sn.

The foundation layer 52 has a first plane 52u. The first plane 52u is, for example, a plane on a side in a (0001) direction. A contact layer (conductive layer) may be provided on an opposite side of the first plane 52u of the foundation layer 52.

Here, a direction parallel to the first direction is defined as a ±Z-axis direction. One direction perpendicular to the ±Z-axis direction and parallel to the first plane 52u is defined as an X-axis direction. A direction perpendicular to the X-axis direction and the ±Z-axis direction is defined as a Y-axis direction. The ±Z-axis direction is a direction perpendicular to the first plane 52u. That is, in this example, the ±Z-axis direction is perpendicular to the plane of the foundation layer 52 in the side in the (0001) direction.

The first semiconductor layer 51 is provided on the foundation layer 52. The first semiconductor layer 51 includes a nitride semiconductor. The first portion 51a and the second portion 51b include a nitride semiconductor. The first semiconductor layer 51 has, for example, the crystal structure of the wurtzite type. The first semiconductor layer 51 uses, for example, a GaN layer of the n-type. For example, the first portion 51a and the second portion 51b include GaN.

The first semiconductor layer 51 has a second plane 51u. The second plane 51u is, for example, a plane on the side in the (0001) direction. The second plane 51u is substantially parallel to the first plane 52u. A lattice length of the first semiconductor layer 51 in an a-axis direction is, for example, not less than 0.3182 nm. More specifically, the a-axis direction is an [11-20] direction in a wurtzite type crystal structure.

FIG. 1B schematically illustrates a plane parallel to the second plane 51u of the first semiconductor layer 51.

As illustrated in FIG. 1B, the first semiconductor layer 51 has a first portion 51a and a second portion 51b. The second portion 51b is, for example, arranged with the first portion 51a in an X-Y plane. That is, the second portion 51b is arranged with the first portion 51a in a direction (second direction) perpendicular to a Z-axis direction. For example, a plurality of second portions 51b is provided. For example, the plurality of second portions 51b is provided by being dispersed to the first portion 51a. A percentage of a total area (a sum of each area of the plurality of second portions 51b) of each second portion 51b to an area of the second plane 51u is, for example, not less than 0.1% and not more than 50%.

The first portion 51a has a first lattice polarity. The second portion 51b has a second lattice polarity. The second lattice polarity of the second portion 51b is different from the first lattice polarity of the first portion 51a. The second lattice polarity is, for example, inverted relative to the first lattice polarity. That is, the second portion 51b includes a polarity inversion portion (inversion domain). Note that in FIG. 1B, although each second portions 51b is illustrated as a circular shape, a shape of the second portion 51b is not limited to the circular shape. The shape of the second portion 51b is arbitrary.

Figure 2A:
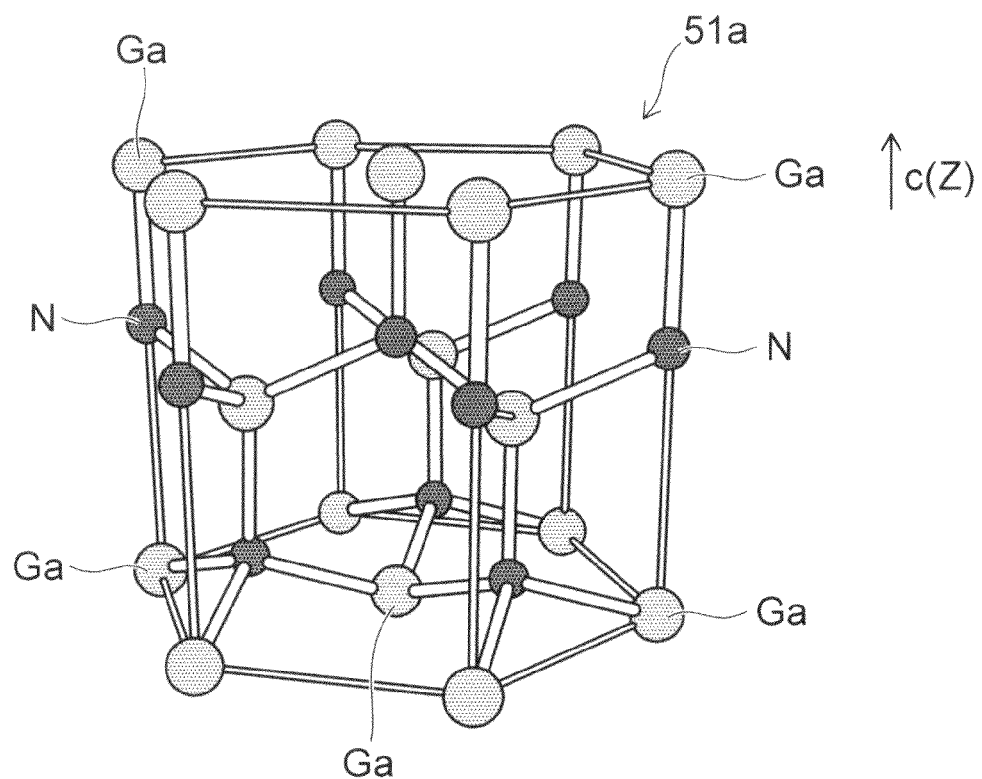
FIG. 2A and FIG. 2B are schematic views illustrating a portion of the semiconductor light emitting device according to the first embodiment.
Figure 2B:
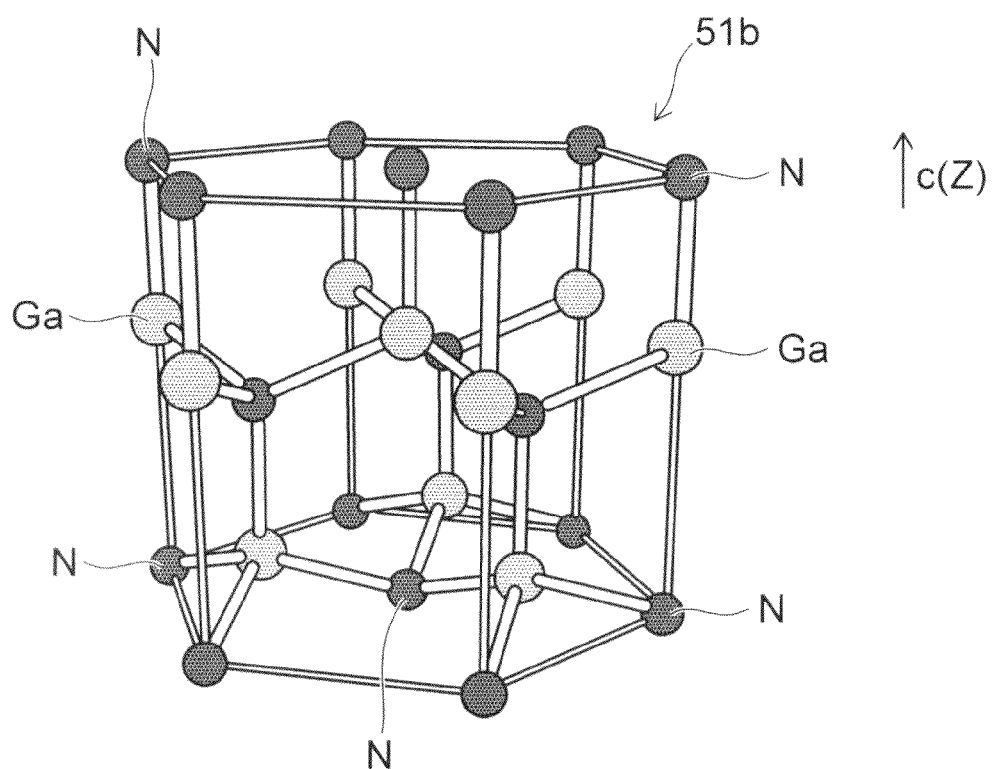

FIG. 2A and FIG. 2B are schematic views illustrating a portion of the semiconductor light emitting device according to the first embodiment.

FIG. 2A is a schematic view illustrating a lattice structure of the first portion 51a. FIG. 2B is a schematic view illustrating a lattice structure of the second portion 51b.

As illustrated in FIG. 2A, Ga appears in the second plane 51u in the first portion 51a. That is, in the first semiconductor layer 51 including GaN, the first portion 51a includes a portion of a Ga polarity. The first lattice polarity is, for example, the Ga polarity. Meanwhile, as illustrated in FIG. 2B, N appears in the second plane 51u in the second portion 51b. That is, in the first semiconductor layer 51 including GaN, the second portion 51b includes a portion of an N polarity. The second lattice polarity is, for example, the N polarity.

The functional layer 10s is provided on a side of the first semiconductor layer 51 in the (0001) direction. The functional layer 10s is, for example, provided on the first semiconductor layer 51. In this example, the functional layer 10s includes a second semiconductor layer 10, a third semiconductor layer 20 and the light emitting layer 30. The semiconductor light emitting device 110 is, for example, a light emitting diode (LED). The semiconductor light emitting device 110 may also be, for example, a laser diode (LD). In this situation, for example, at least portions of the second semiconductor layer 10 and the third semiconductor layer 20 guide light released from the light emitting layer 30.

The second semiconductor layer 10 is provided on the side of the first semiconductor layer 51 in the (0001) direction. The second semiconductor layer 10 is, for example, provided on the first semiconductor layer 51. That is, the second semiconductor layer 10 is provided between the first semiconductor layer 51 and the light emitting layer 30. The second semiconductor layer 10 includes a nitride semiconductor. The second semiconductor layer 10 includes, for example, GaN of a first conductivity type. The first conductivity type is the n-type and a second conductivity type is a p-type. However, the first conductivity type may be the p-type and the second conductivity type may be the n-type. Hereinafter, a situation where the first conductivity type is the n-type, and the second conductivity type is the p-type will be described. The second semiconductor layer 10 is, for example, an n-type GaN layer. The impurity of the n-type in the second semiconductor layer 10 may use, for example, at least one of O, Si, Ge, Te, and Sn.

The light emitting layer 30 is provided on a side of the second semiconductor layer 10 in the (0001) direction. The light emitting layer 30 is arranged with the first semiconductor layer 51 in the Z-axis direction (first direction). The light emitting layer 30 includes, for example, a barrier layer 33 and a well layer 34. The well layer 34 includes, for example, $In_xGa_{1-x}N$. The barrier layer 33 includes, for example, GaN.

The third semiconductor layer 20 is provided on a side of the light emitting layer 30 in the (0001) direction. That is, the light emitting layer 30 is disposed between the second semiconductor layer 10 and the third semiconductor layer 20. The third semiconductor layer 20 is, for example, provided on the light emitting layer 30. The third semiconductor layer 20 includes a nitride semiconductor and is of the second conductivity type. The third semiconductor layer 20 is, for example, a p-type GaN layer. The impurity of the p-type in the third semiconductor layer 20 may use, for example, at least one of Mg, Zn, C, Be, and Mn.

The light is released from the light emitting layer 30 by passing a current to the light emitting layer 30 via the second semiconductor layer 10 and the third semiconductor layer 20. A peak wavelength of the light released from the light emitting layer 30 is, for example, not less than 390 nm and not more than 670 nm. That is, the light emitting layer 30 releases light in a visible light region.

The functional layer 10s further includes an In-containing layer 32. The In-containing layer 32 is provided between the second semiconductor layer 10 and the light emitting layer 30. That is, the In-containing layer 32 is provided on the side of the second semiconductor layer 10 in the (0001) direction, and the light emitting layer 30 is provided on a side of the In-containing layer 32 in the (0001) direction. That is, the In-containing layer 32 is provided on the second semiconductor layer 10 and the light emitting layer 30 is provided on the In-containing layer 32. The In-containing layer 32 is provided appropriately to the functional layer 10s and can be omitted.

The In-containing layer 32 includes a nitride semiconductor including In. The In-containing layer 32 includes, for example, $In_yGa_{1-y}n$. A composition ratio of In in the In-containing layer 32 is different from a composition ratio of In in the light emitting layer 30. A composition ratio y of In in the In-containing layer 32 is, for example, lower than a composition ratio x of the In in the well layer 34. The composition ratio y of In in the In-containing layer 32 may be higher than the composition ratio x of In in the well layer 34. A lattice length of the In-containing layer 32 in the a-axis direction is not less than 0.1% greater than a lattice length of the first semiconductor layer 51 in the a-axis direction. That is, the lattice length of the In-containing layer 32 in the a-axis direction is not less than 0.3185 nm.

Furthermore, a difference of the lattice length of the In-containing layer 32 in the a-axis direction and the lattice length of the light emitting layer 30 in the a-axis direction is within ±0.1%. That is, the lattice length of the light emitting layer 30 in the a-axis direction is greater than the lattice length of the first semiconductor layer 51 in the a-axis direction.

Figure 3A:
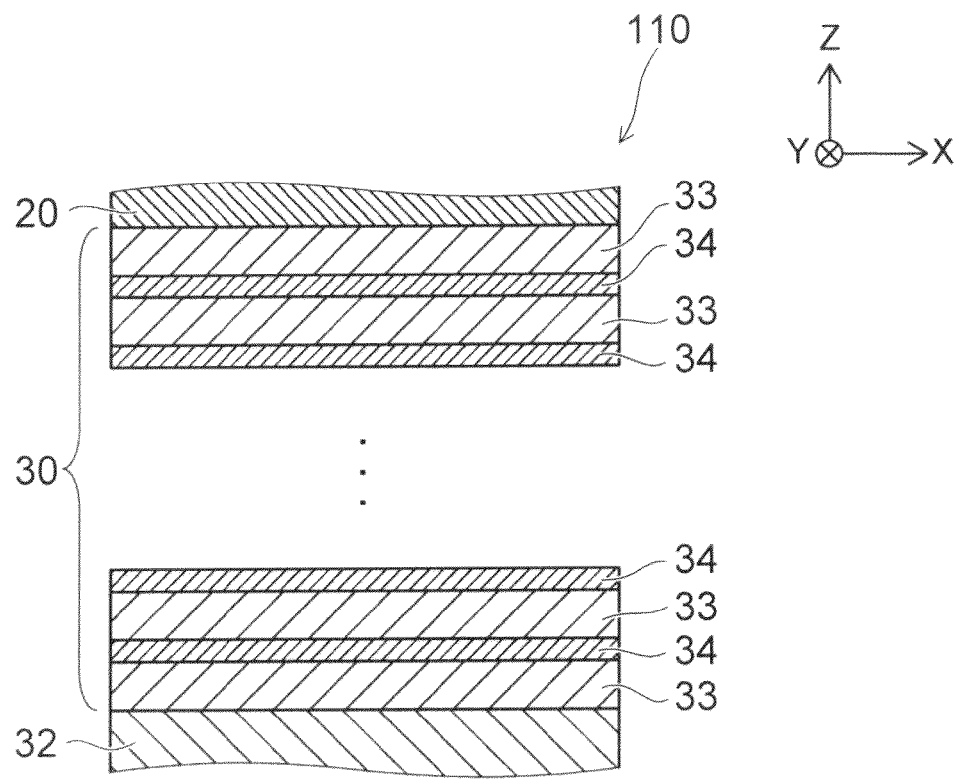
FIGS. 3A and 3B are cross-sectional views schematically illustrating a portion of the semiconductor light emitting device according to the first embodiment.
Figure 3B:
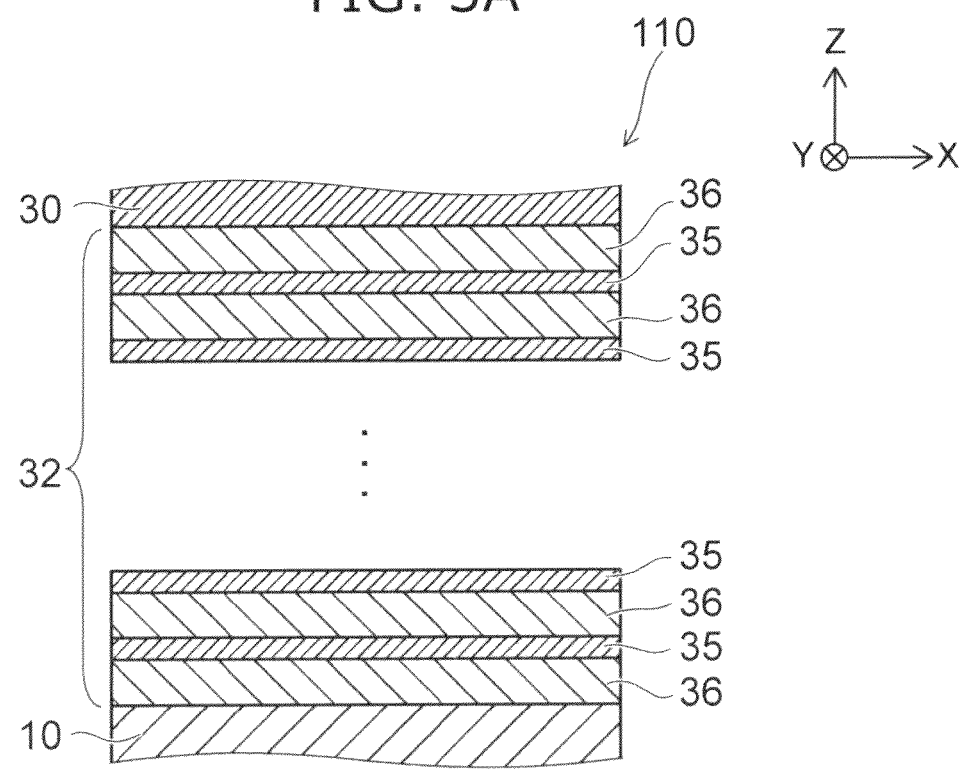

FIGS. 3A and 3B are cross-sectional views schematically illustrating a portion of the semiconductor light emitting device according to the first embodiment.

As illustrated in FIG. 3A, the light emitting layer 30 includes a plurality of barrier layers 33 and a plurality of well layers 34. Each of the plurality of barrier layers 33 and each of the plurality of well layers 34 are alternately stacked in the ±Z-axis direction.

The number of well layers 34 may be one or more. That is, the light emitting layer 30 may have a single-quantum well (SQW) structure or a multi-quantum well (MQW) structure.

A bandgap energy of the barrier layer 33 is higher than a bandgap energy of the well layer 34. $In_xGa_{1-x}N$ ($0<x<1$), for example, is used in the well layer 34. $Al_pIn_zGa_{1-z-p}N$ ($0<z<1$, $0<p<1, z+p<1$), for example, is used in the barrier layer 33.

For example, the bandgap energy of the well layer 34 and a thickness (length in the z-axis direction) of the well layer 34 are adjusted. By this, the peak wavelength of the light released from the light emitting layer 30 becomes not less than 390 nm and not more than 670 nm. The well layer 34 includes, for example, $In_xGa_{1-x}N$ ($0.1<x\leq0.4$). A composition ratio of In in each first intermediate layer 35 is, for example, not less than 0.01 and not more than 0.2. Each second intermediate layer 36 includes, for example, a nitride semiconductor including Ga. Each second intermediate layer 36 includes, for example, GaN.

As illustrated in FIG. 3B, the In-containing layer 32 includes a plurality of first intermediate layers 35 and a plurality of second intermediate layers 36. Each of the plurality of first intermediate layers 35 and each of the plurality of second intermediate layers 36 are alternately stacked in the ±Z-axis direction (the first direction heading toward the light emitting layer 30 from the second semiconductor layer 10). The In-containing layer 32 is, for example, a super lattice layer.

Each first intermediate layer 35 includes a nitride semiconductor including In. Each second intermediate layer 36 includes a nitride semiconductor. Each first intermediate layer 35 includes, for example, $In_qGa_{1-q}N$ ($0<q<1$). A composition ratio of In in each first intermediate layer 35 is, for example, not less than 0.01 and not more than 0.2. Each second intermediate layer 36 includes, for example, a nitride semiconductor including Ga. Each second intermediate layer 36 includes, for example, GaN.

Each bandgap energy of each of the plurality of first intermediate layers 35 is lower than each bandgap energy of the plurality of second intermediate layers 36. Each bandgap energy of each of the plurality of first intermediate layers 35 is higher than each bandgap energy of each of the plurality of well layers 34. A thickness of each first intermediate layer 35 is, for example, not less than 0.5 nm and not more than 5 nm. A thickness of each second intermediate layer 36 is, for example, not less than 0.5 nm and not more than 10 nm.

In this manner, in this example, the well layer 34 in the light emitting layer 30 includes In, and the first intermediate layer 35 in the In-containing layer 32 includes In. That is, the composition ratio of In in the first intermediate layer 35 is different from the composition ratio of In in the well layer 34. The composition ratio of In in the first intermediate layer 35 is, for example, lower than the composition ratio of In in the well layer 34. The lattice length of the first intermediate layer 35 in the a-axis direction is not less than 0.1% greater than the lattice length of the first semiconductor layer 51 in the a-axis direction. A difference between the lattice length of the first intermediate layer 35 in the a-axis direction and a lattice length of the well layer 34 in the a-axis direction is within ±0.1%.

Next, an example of a manufacturing method of the semiconductor light emitting device 110 will be described.

Note that, hereinafter, a situation where metal organic chemical vapor deposition (MOCVD) is used will be illustrated. In manufacturing the semiconductor light-emitting device according to the embodiments, for example, any method used for growing a nitride semiconductor may be adopted, such as metal-organic vapor phase epitaxy, halide vapor phase epitaxy (HVPE), or molecular beam epitaxy (MBE).

Figure 4:
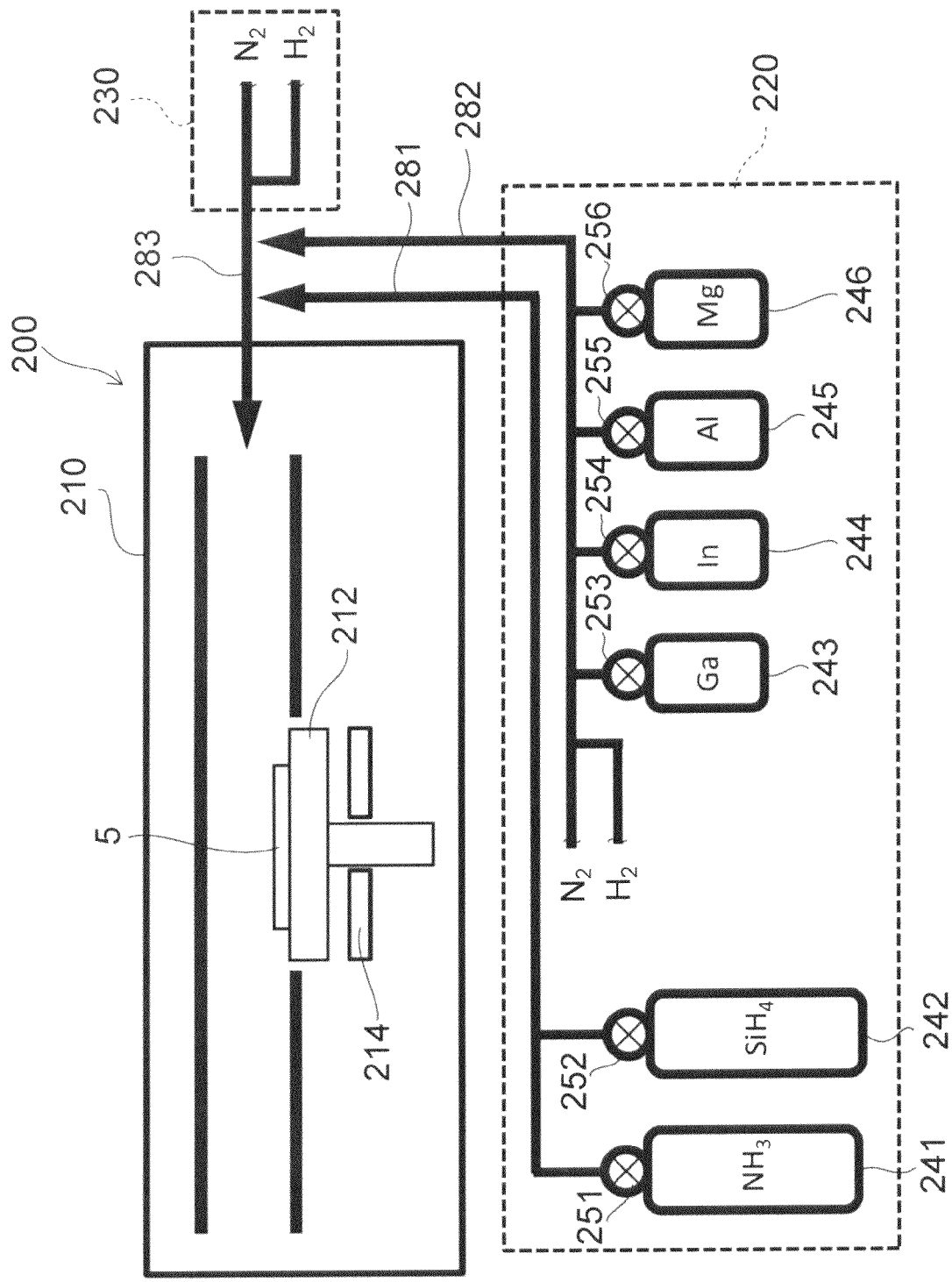
FIG. 4 is a block diagram schematically illustrating one example of a semiconductor manufacturing device.

FIG. 4 is a block diagram schematically illustrating one example of a semiconductor manufacturing device.

As illustrated in FIG. 4, a semiconductor manufacturing device 200 includes a reacting furnace 210, a raw material supply unit 220, carrier gas supply unit 230, and first to third pipes 281 to 283. In this example, the semiconductor manufacturing device 200 is an MOCVD device.

The reacting furnace 210 includes a susceptor 212 and a heater 214. The susceptor 212 and the heater 214 are provided inside the reacting furnace 210. The susceptor 212 is a support base for supporting a substrate 5. The heater 214 controls a temperature of the susceptor 212.

The raw material supply unit 220 includes, for example, first to sixth tanks 241 to 246 and first to sixth valves 251 to 256. The first tank 241 stores, for example, ammonia. The first tank 241 is connected to the first pipe 281 via the first valve 251. The second tank 242 stores, for example, monosilane. The second tank 242 is connected to the first pipe 281 via the second valve 252. The third tank 243 stores, for example, trimethyl gallium. The third tank 243 is connected to the second pipe 282 via the third valve 253. The fourth tank 244 stores, for example, trimethyl indium. The fourth tank 244 is connected to the second pipe 282 via the fourth valve 254. The fifth tank 245 stores, for example, trimethyl aluminum. The fifth tank 245 is connected to the second pipe 282 via the fifth valve 255. The sixth tank 246 stores, for example, cyclopentadienyl magnesium. The sixth tank 246 is connected to the second pipe 282 via the sixth valve 256.

The raw material supply unit 220 further includes a nitrogen purification device and a hydrogen purification device (not illustrated). The nitrogen purification device and the hydrogen purification device are, for example, connected to the second pipe 282.

The carrier gas supply unit 230 includes, for example, the nitrogen purification device and the hydrogen purification device (not illustrated). The nitrogen purification device and the hydrogen purification device are, for example, connected to the third pipe 283.

The first to third pipes 281 to 283 are connected to the reacting furnace 210. By this, each gas stored in each of the first to sixth tanks 241 to 246 is supplied in the reacting furnace 210 at a predetermined flow rate according to a regulation of opening and closing of the first to sixth valves 251 to 256. Then, the nitrogen gas and the hydrogen gas are supplied in the reacting furnace 210 at a predetermined flow rate from each purification device.

Trimethyl gallium (TMGa) or triethyl gallium (TEGa), for example, is used as a raw material of Ga. Trimethyl indium (TMIn), for example, is used as a raw material of In. Trimethyl aluminum (TMAl), for example, is used as a raw material of Al. Ammonia ($NH_3$), for example, is used as a raw material of N. Monosilane ($SiH_4$), for example, is used as a raw material of Si. Cyclopentadienyl magnesium ($Cp_2Mg$), for example, is used as a raw material of Mg. TMGa, TEGa, TMIn, TMAl, $NH_3$, $SiH_4$, and $Cp_2Mg$ are used as gas raw materials. The raw materials are not limited to the above and may use any material capable of manufacturing the semiconductor light emitting device 110 according to the embodiment. Nitrogen and hydrogen, for example, are used as carrier gas.

In manufacturing the semiconductor light emitting device 110, first, the substrate 5 is set in the susceptor 212 provided in the reacting furnace 210 of the semiconductor manufacturing device 200. By supplying hydrogen as the carrier gas in the reacting furnace 210 and by making the temperature of the susceptor 212 1160° C., thermal cleaning of the substrate 5 is performed in a hydrogen atmosphere.

A sapphire substrate, for example, is used as the substrate 5. The substrate 5 may also be, for example, a silicon substrate. For example, any one of silicon substrates (110), (111), and (100) may be used as the substrate 5.

After lowering the temperature of the susceptor 212 to 500° C., by supplying hydrogen as the carrier gas and by supplying TMGa and $NH_3$ as the raw material gases, the GaN layer is formed as the foundation layer 52 on the substrate 5. A growth temperature of the foundation layer 52 is, for example, not less than 400° C. and not more than 600° C. A growth time of the foundation layer 52 is, for example, three minutes. A thickness of foundation layer 52 is, for example, not less than 5 nm and not more than 200 nm.

In this example, the growth temperature is, for example, the temperature of the susceptor 212. The growth temperature may be a temperature of the substrate 5, a temperature of a gas surrounding the substrate 5 (ambient temperature), or a temperature of a film itself while growing. The temperature of the substrate 5 and the temperature of the film while growing may be measured by, for example, a temperature sensor of a non-contact type that uses an infrared rays or the likes.

After forming the foundation layer 52, the temperature of the susceptor 212 is raised to 1120° C. At this time, the temperature of the susceptor 212 is, for example, gradually raised from 500° C. to 1120° C. over about twelve minutes.

By supplying a mixed gas of nitrogen and hydrogen as the carrier gas and by supplying TMGa and $NH_3$ as the raw material gases after raising the temperature of the susceptor 212 to 1120° C., the GaN layer is formed as the first semiconductor layer 51 on the foundation layer 52. A thickness of the first semiconductor layer 51 is, for example, not less than 1 μm and not more than 10 μm.

In the carrier gas, a flow rate of nitrogen supplied in the reacting furnace 210 is, for example, 15.5 slm (standard liter/minute). A flow rate of hydrogen is, for example, 5 slm. In this manner, in forming the first semiconductor layer 51, the carrier gas includes at least nitrogen and hydrogen. A mixing ratio of nitrogen in this carrier gas is greater than a mixing ratio of hydrogen therein. When the mixing ratio of hydrogen is set to be 1, the mixing ratio of nitrogen is set to be greater than 1. That is, in forming the first semiconductor layer 51, a concentration of nitrogen is higher than a concentration of hydrogen in the reacting furnace 210. A mixing ratio of nitrogen is, for example, not less than 0.5 and not more than 0.95.

By further supplying $SiH_4$ in addition to TMGa and $NH_3$ after forming the first semiconductor layer 51, a GaN layer including Si is formed as the second semiconductor layer 10 on the first semiconductor layer 51. A thickness of the second semiconductor layer 10 is, for example, not less than 2 μm and not more than 5 μm. A growth temperature of the second semiconductor layer 10 is, for example, not less than 1100° C. and not more than 1200° C.

By supplying nitrogen as the carrier gas and by supplying TMGa, TMIn, and $NH_3$ as the raw material gases after lowering the temperature of the susceptor 212 to 810° C., an InGaN layer is formed as the first intermediate layer 35 on the second semiconductor layer 10. A thickness of the first intermediate layer 35 is, for example, 1 nm. By supplying nitrogen as the carrier gas and by supplying TMGa, $NH_3$, and $SiH_4$ as the raw material gases, the GaN layer including Si is formed as the second intermediate layer 36 on the first intermediate layer 35. A thickness of the second intermediate layer 36 is, for example, 2 nm. Forming the first intermediate layer 35 and forming the second intermediate layer 36 are repeated, for example, thirty times. By this, the In-containing layer 32 having a stacked structure where the first intermediate layer 35 and the second intermediate layer 36, are stacked for thirty cycles is formed on the second semiconductor layer 10.

By supplying nitrogen as the carrier gas and by supplying TMGa and $NH_3$ as the raw material gases after raising the temperature of the susceptor 212 to 890° C., the GaN layer is formed as the barrier layer 33 on the In-containing layer 32. A thickness of the barrier layer 33 is, for example, not less than 1 nm and not more than 100 nm. By further supplying TMIn as the raw material gas after lowering the temperature of the susceptor 212 to 750° C., the well layer 34 that is the InGaN layer is formed on the barrier layer 33. A thickness of the well layer 34 is, for example, 3 nm. Forming the barrier layer 33 and forming the well layer 34 are repeated, for example, four times. By this, the light emitting layer 30 having a stacked structure where the barrier layer 33 and the well layer 34 are stacked for four cycles is formed on the In-containing layer 32.

By supplying the mixed gas of nitrogen and hydrogen as the carrier gas and by supplying TMGa, $Cp_2Mg$, and $NH_3$ as the raw material gases after raising the temperature of the susceptor 212 to 1030° C., a GaN layer including Mg is formed as the third semiconductor layer 20 on the light emitting layer 30. A thickness of the third semiconductor layer 20 is, for example, not less than 10 nm and not more than 200 nm.

By the above, the semiconductor light emitting device 110 illustrated in FIG. 1 is obtained.

Next, an experiment conducted by the inventors will be described.

In the experiment, a plurality of samples SP01 of the semiconductor light emitting device 110 was made with the manufacturing procedure described above. Moreover, in the experiment, a plurality of samples SP02 of the semiconductor light emitting device of a reference example was made, and characteristics of each sample SP01 and SP02 were evaluated. In the sample SP02 of the reference example, in forming the first semiconductor layer 51, the mixing ratio of hydrogen in the carrier gas was made to be greater than the mixing ratio of nitrogen therein. That is, in the sample SP02 of the reference example, the first semiconductor layer 51 was formed in a state where the concentration of hydrogen in the reacting furnace 210 is greater than the concentration of nitrogen therein. Specifically, in the carrier gas, the flow rate of nitrogen supplied in the reacting furnace 210 was set to be 5 slm and the flow rate of hydrogen was set to be 15.5 slm. In the sample SP01 of the semiconductor light emitting device 110, a percentage of nitrogen relative to the carrier gas is 75.6%, and in the sample SP02 of the reference example, a percentage of hydrogen relative to the carrier gas is 75.6%.

In this manner, the inventors made a plurality of samples of different manufacturing procedures of the first semiconductor layer 51, and by measuring characteristics of each sample, extensive studies were performed on a relationship between the first semiconductor layer 51 and characteristics of the device. In the experiment, a photoluminescence (PL) strength of each sample SP01, SP02 was measured.

Figure 5:
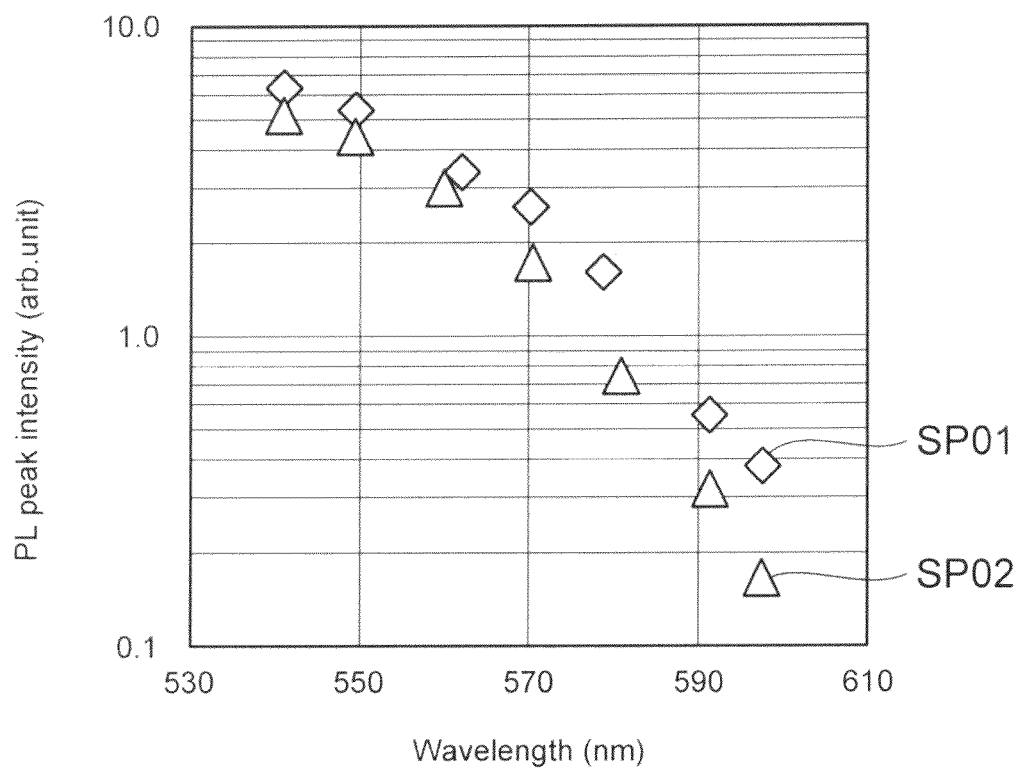
FIG. 5 is a graph illustrating one example of an experimental result.
Figure 6:
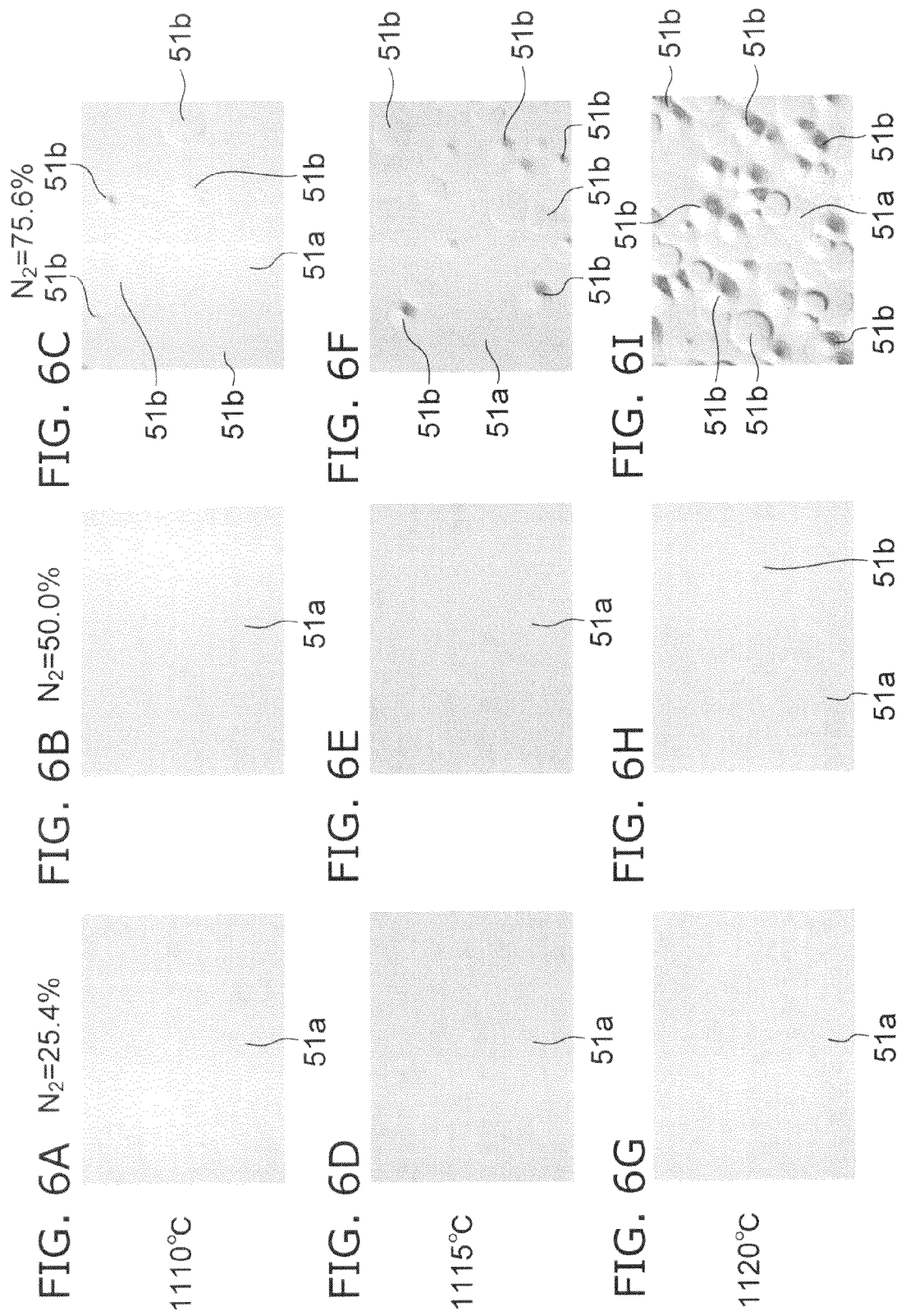
FIGS. 6A to 6I are differential interference micrograph showing one example of the experimental result.

FIG. 5 is a graph illustrating one example of an experimental result.

The vertical axis in FIG. 5 is a PL strength (arbitrary unit) of the light released from the light emitting layer 30 in PL measurement and the horizontal axis is the wavelength (nm) of the light released from the light emitting layer 30.

As illustrated in FIG. 5, the PL strength of the sample SP01 of the semiconductor light emitting device 110 was improved compared to the sample SP02 of the reference example. In the experiment, in all ranges of a measured wavelength region (540 nm to 600 nm), the PL strength of the sample SP01 was greater than the PL strength of the sample SP02. The PL strength of the sample SP01 is about 15% greater than the PL strength of the sample SP02. That is, the luminous efficiency of the semiconductor light emitting device 110 according to the embodiment is high compared to that of the reference example.

The inventors observed the second plane 51u of the first semiconductor layer 51 of each sample SP01, SP02 by a convergent beam electron diffraction (CBED) method using a transmission electron microscope (TEM). As a result, it was found that compared to the second sample SP02, the sample SP01 had more of the second portion 51b. That is, the inventors found that luminous efficiency improves by providing the functional layer 10s on the first semiconductor layer 51 that includes the second portion 51b (polarity inversion portion).

The inventors further made a plurality of samples where the percentage of nitrogen in the carrier gas when forming the first semiconductor layer 51 and the growth temperature of the first semiconductor layer 51 are changed and further studied a relationship of a growth condition of the first semiconductor layer 51 and an occurrence of polarity inversion.

In the experiment, the percentage of nitrogen relative to the carrier gas was changed to 25.4%, 50.0%, and 75.6%. Then, the growth temperature was changed to 1110° C., 1115° C., and 1120° C. That is, in the experiment, the percentage of nitrogen was changed in three steps, the growth temperature was changed in three steps and the second plane 51u of the first semiconductor layer 51 for each of nine total samples was observed with the TEM.

FIGS. 6A to 6I are differential interference micrograph showing one example of the experimental result.

As shown in FIGS. 6A to 6I, when the percentage of nitrogen relative to the carrier gas is made to be 25.4% and 50.0%, the second portion 51b rarely occurs. In contrast, when the percentage of nitrogen to the carrier gas is made to be 75.6%, the second portion 51b occurs. In this manner, an occurrence frequency of the second portion 51b when the percentage of nitrogen relative to the carrier gas is made to be 75.6% is greater than the occurrence frequency when the percentage of nitrogen to the carrier gas is made to be 25.4% and 50.0%).

The sample SP01 described above corresponds to (FIG. 6I) when the percentage of nitrogen is made to be 75.6% and the growth temperature is made to be 1120° C. Meanwhile, the sample SP02 described above corresponds to (FIG. 6G) when the percentage of hydrogen is made to be 25.4% and the growth temperature is made to be 1120° C. In this manner, the luminous efficiency improves by providing the functional layer 10s on the first semiconductor layer 51 that includes the second portion 51b.

In forming the first semiconductor layer 51, the percentage of nitrogen relative to the carrier gas is made to be 75.6% (for example, not less than 50% and not more than 95.0%). Then, the growth temperature is made to be 1120° C. (for example, not less than 1100° C. and not more than 1180° C.). By this, the second portion 51b may be provided to the first semiconductor layer 51.

As described above, a presence or absence of the second portion 51b may be determined by, for example, the CBED method using the TEM. When functional layer 10s or the like is provided on the first semiconductor layer 51, the functional layer 10s is ground by, for example, an ion milling method or a focused ion beam (FIB) method to expose the second plane 51u of the first semiconductor layer 51. By this, determination by the CBED method or the like is made possible.

The inventors measured the lattice length in the a-axis direction for each layer of each sample SP01, SP02 as described above. The lattice length in the a-axis direction may be evaluated by, for example, X-ray diffraction (XRD) measurement.

Figure 7:
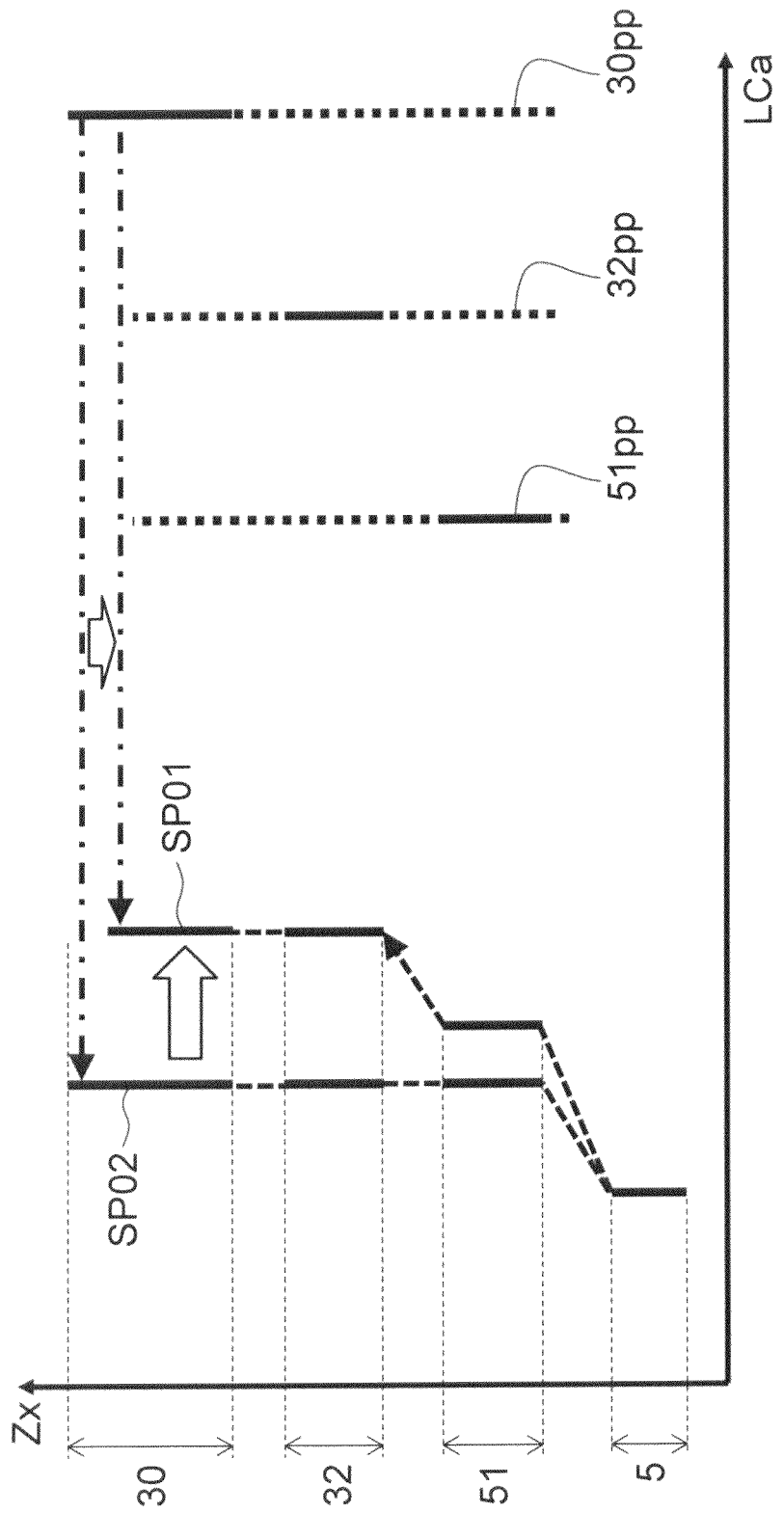
FIG. 7 is a graph schematically showing one example of the experimental result.

FIG. 7 is a graph schematically showing one example of the experimental result.

The horizontal axis in FIG. 7 is a lattice length LCa in the a-axis direction, and the vertical axis is a position Zx in a +Z-axis direction. The horizontal axis in FIG. 7 shows that the lattice length increases as it moves toward a right side.

Furthermore, in FIG. 7, 51pp shows a physical property value of the lattice length of the first semiconductor layer 51 (GaN layer) in the a-axis direction. A physical property value 51pp is, for example, 0.3189 nm. 32pp shows an average of the physical property value of the lattice length of the In-containing layer 32 in the a-axis direction. A physical property value 32pp is, for example, 0.3206 nm. 30pp shows an average of the physical property value of the lattice length of the light emitting layer 30 in the a-axis direction. The physical property value 30pp is, for example, 0.3293 nm.

Figure 8A:
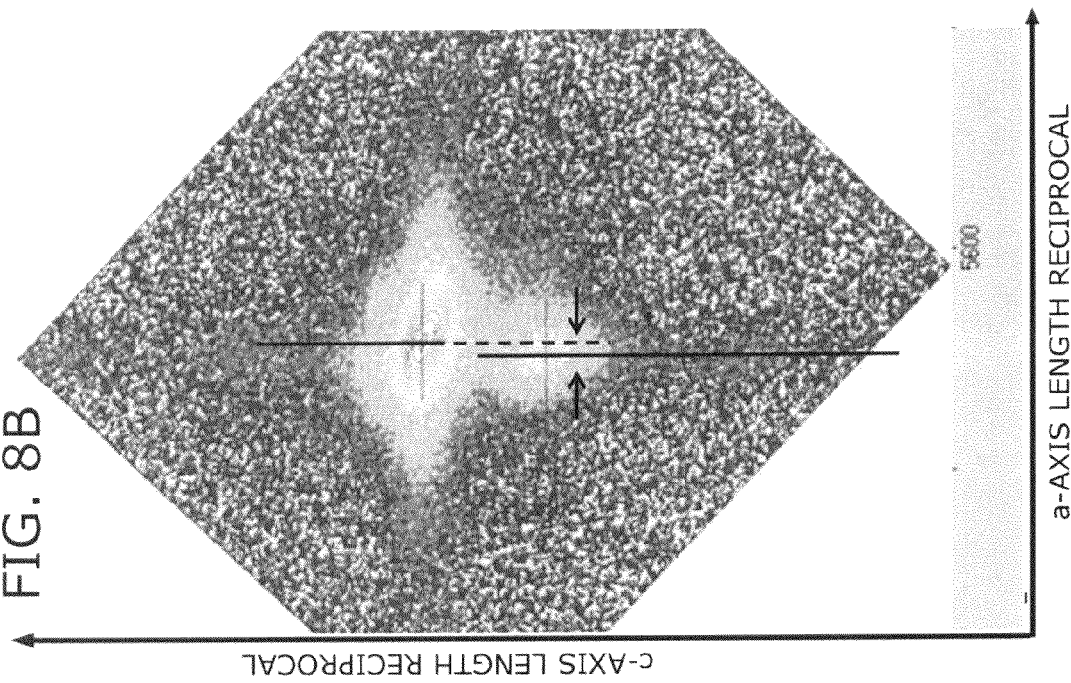
FIGS. 8A and 8B are reciprocal space mapping diagrams showing one example of the experimental result.
Figure 8B:
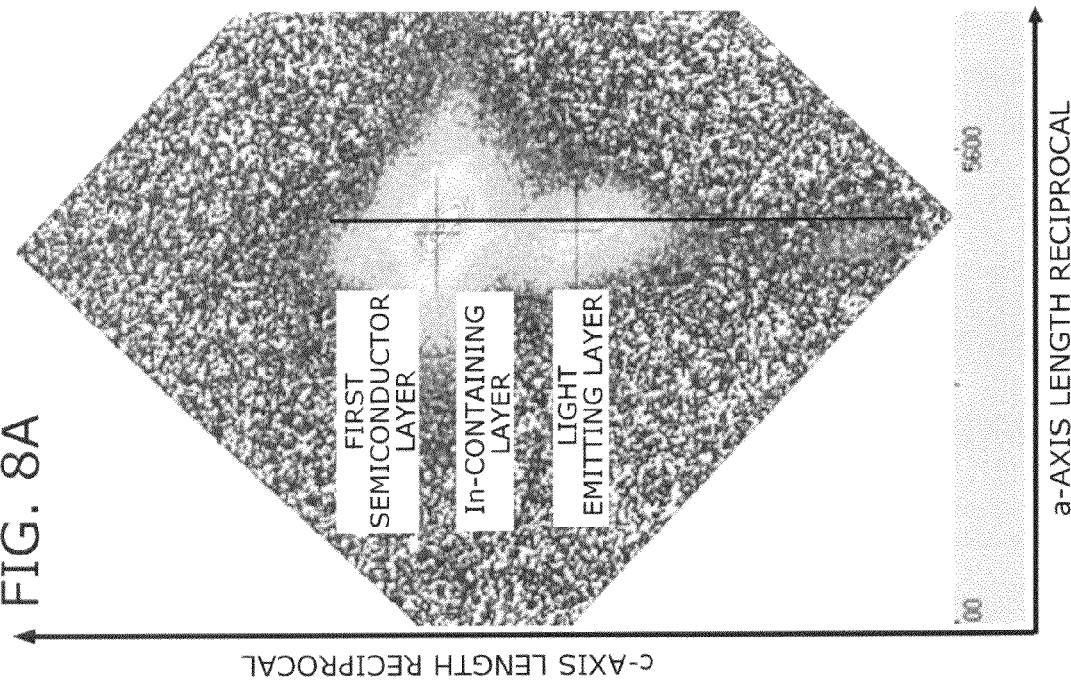

FIGS. 8A and 8B are reciprocal space mapping diagrams showing one example of the experimental result.

FIG. 8A shows one example of the experimental result of the sample SP02. FIG. 8B shows one example of the experimental result of the sample SP01.

Figure 9:
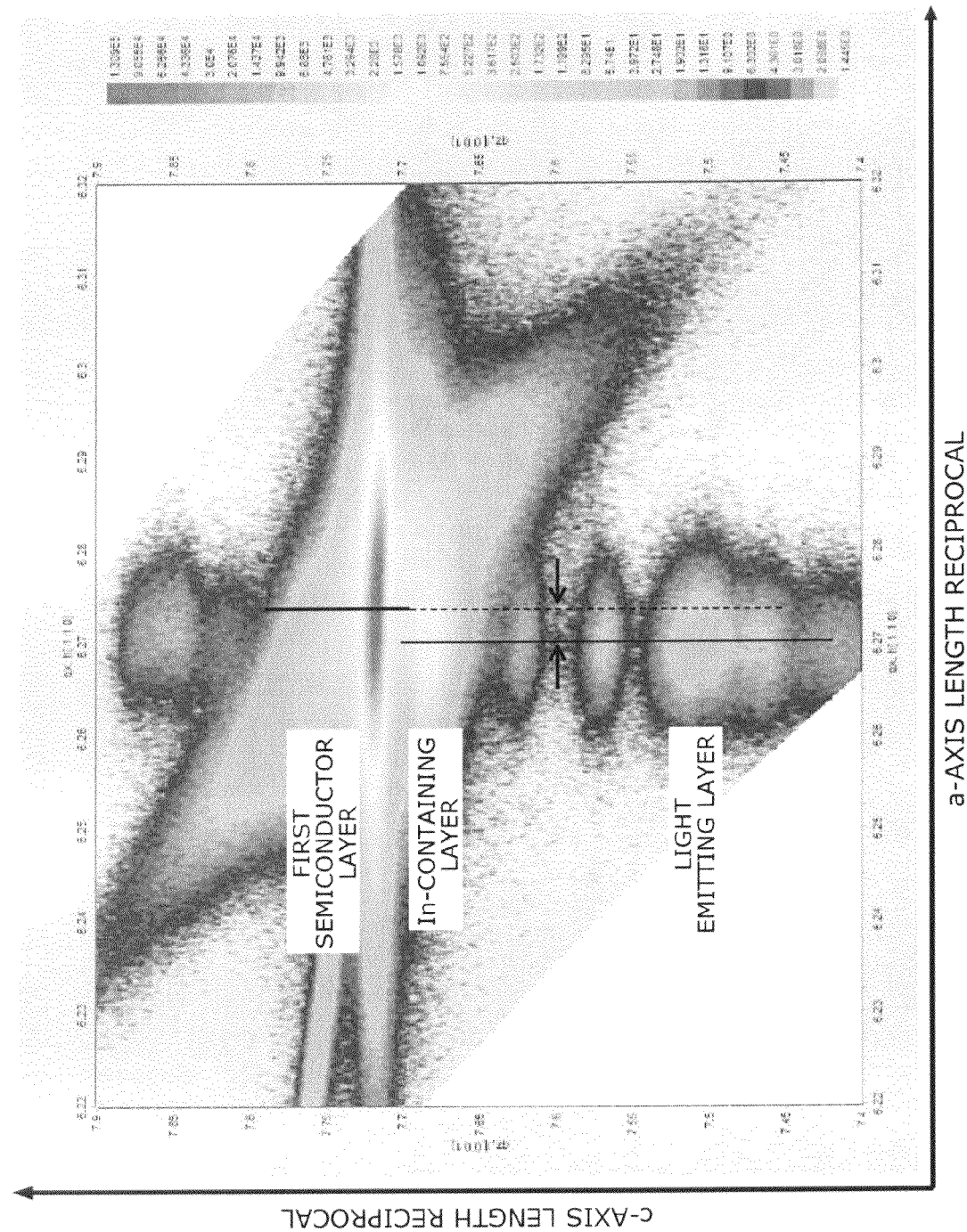
FIG. 9 is a reciprocal space mapping diagram showing one example of the experimental result.

FIG. 9 is a high resolution reciprocal space mapping diagram of FIG. 8B.

As shown in FIGS. 7 to 9, the lattice length of the first semiconductor layer 51 in the a-axis direction in the sample SP01 is greater than the lattice length of the first semiconductor layer 51 in the a-axis direction in the sample SP02. An actual lattice length of the first semiconductor layer 51 in the a-axis direction may be estimated by a Raman shift by Raman spectroscopy or the like. The lattice length of the first semiconductor layer 51 in the a-axis direction in the sample SP02 was 0.3181 nm. Meanwhile, the lattice length of the first semiconductor layer 51 in the a-axis direction in the sample SP01 was 0.3185 nm.

The lattice length of the first semiconductor layer 51 in the a-axis direction is smaller than the physical property value 51*pp* due to, for example, a lattice constant difference between the substrate 5. That is, compressive strain is added to the first semiconductor layer 51. In the sample SP01, the lattice length of the first semiconductor layer 51 in the a-axis direction, is closer to the physical property value 51*pp* than in the sample SP02.

Furthermore, in the sample SP02 of the reference example, the lattice length of the In-containing layer 32 in the a-axis direction and the lattice length of the light emitting layer 30 in the a-axis direction are substantially the same as the lattice length of the first semiconductor layer 51 in the a-axis direction. In contrast, in the sample SP01 of the semiconductor light emitting device 110 according to the embodiment, the lattice length of the In-containing layer 32 in the a-axis direction and the lattice length of the light emitting layer 30 in the a-axis direction are greater than the lattice length of the first semiconductor layer 51 in the a-axis direction. In the sample SP01, the lattice length of the In-containing layer 32 in the a-axis direction and the lattice length of the light emitting layer 30 in the a-axis direction are, for example, 0.3376 nm. In this manner, the lattice length of the light emitting layer 30 in the a-axis direction in the sample SP01 is about 0.7% greater than the lattice length of the light emitting layer 30 in the a-axis direction in the sample SP02. Moreover, by this, in the sample SP01, the lattice length of the light emitting layer 30 in the a-axis direction is closer to the physical property value 30*pp* than in the sample SP02.

In this manner, the inventors found that the lattice length in the a-axis direction of the first semiconductor layer 51 that includes the second portion 51*b* is greater than the lattice length in the a-axis direction of the first semiconductor layer 51 that substantially does not include the second portion 51*b*. It was found that the lattice length in the a-axis direction of the first semiconductor layer 51 that includes the second portion 51*b* is not less than 0.3182 nm. Moreover, by providing the In-containing layer 32 on the first semiconductor layer 51, it was found that the lattice length of the In-containing layer 32 in the a-axis direction is not less than 0.1% greater than the lattice length of the first semiconductor layer 51 in the a-axis direction.

As described above, in the semiconductor light emitting device 110 according to the embodiment, the luminous efficiency improves compared to the reference example. This is, believed to be due to the lattice length of the light emitting layer 30 in the a-axis direction approaching the physical property value 30*pp* and a crystal quality of the light emitting layer 30 being improved.

The polarity inversion portion included in the GaN layer is known to degrade the characteristics of the semiconductor light emitting device causing a leak to occur or the like. The inventors fabricated the semiconductor light emitting device 110 in the visible light region by using the first semiconductor layer 51 including many polarity inversion portions (second portion 51*b*). As a result, it was found that the luminous efficiency improves without degradation of a current characteristic, such as leaking. This is a new effect found by the experiments of the inventors.

Figure 10:
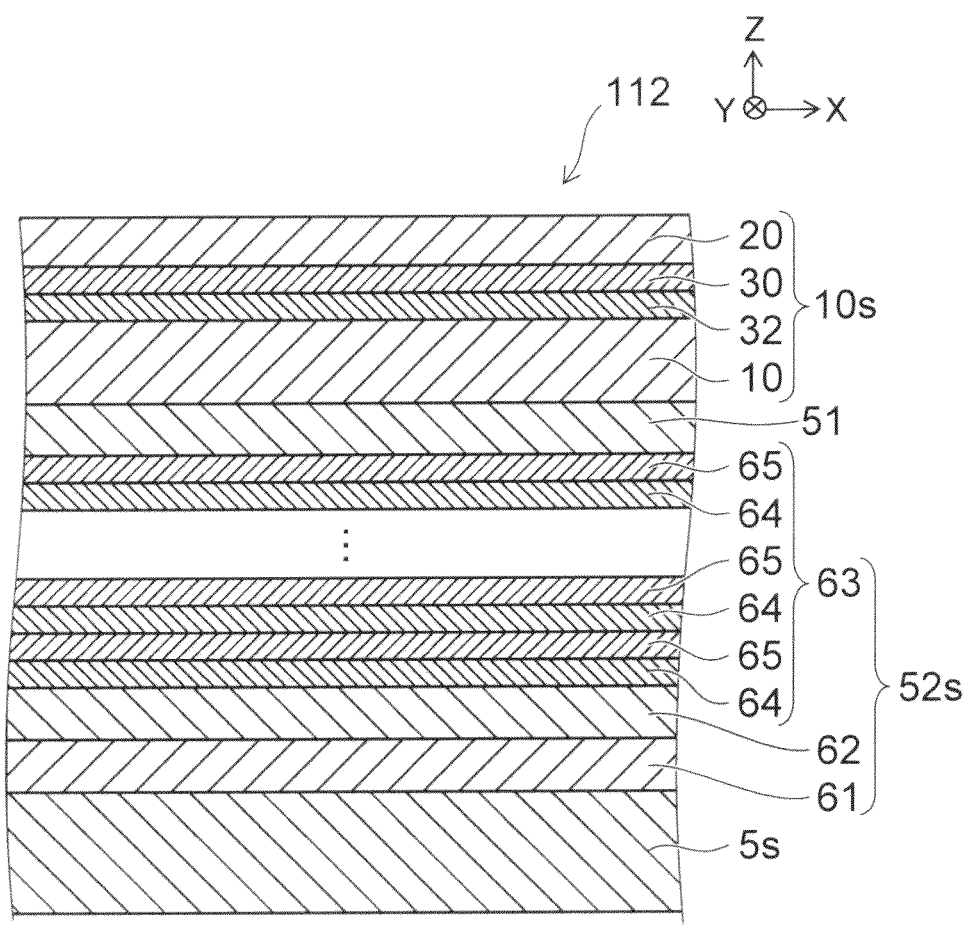
FIG. 10 is a cross-sectional view schematically illustrating a separate semiconductor light emitting device according to the first embodiment.

FIG. 10 is a cross-sectional view schematically illustrating a separate semiconductor light emitting device according to the first embodiment.

As illustrated in FIG. 10, a semiconductor light emitting device 112 includes a silicon substrate 5*s*, a foundation layer 52*s*, the first semiconductor layer 51, and the functional layer 10*s*. In the semiconductor light emitting device 112, the silicon substrate 5*s* is provided as needed and can be omitted.

The foundation layer 52*s* is provided on the silicon substrate 5*s*. The foundation layer 52*s* includes an AlN buffer layer 61 provided on the silicon substrate 5*s* and an AlGaN buffer layer 62 provided on the AlN buffer layer 61. The foundation layer 52*s* includes, for example, a multilayer buffer layer 63 provided on the AlGaN buffer layer 62. The multilayer buffer layer 63 includes, for example, a plurality of AlGaN layers 64 and a plurality of GaN layers 65 alternately stacked along the Z-axis direction.

The first semiconductor layer 51 is provided on a side of the foundation layer 52*s* in the (0001) direction. That is, the first semiconductor layer 51 is provided on the foundation layer 52*s*. Because a portion on a side of the first semiconductor layer 51 in the (0001) direction is substantially the same as the semiconductor light emitting device 110 as described above, detailed description thereof will be omitted.

In the semiconductor light emitting device 112 of this example as well, the luminous efficiency can be improved by suppressing degradation of the current characteristics such as leaking.

Second Embodiment

Figure 11:
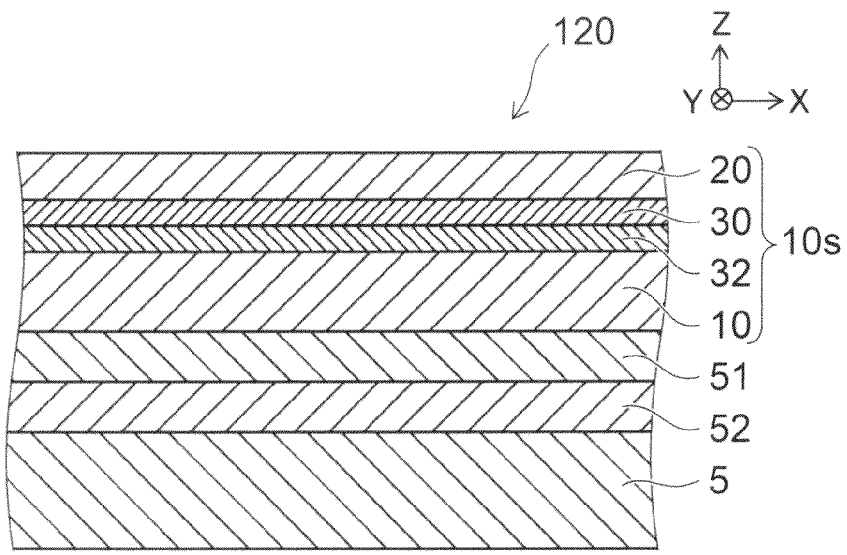
FIG. 11 is a cross-sectional view schematically illustrating a semiconductor wafer according to a second embodiment.

FIG. 11 is a cross-sectional view schematically illustrating a semiconductor wafer according to a second embodiment.

As illustrated in FIG. 11, a semiconductor wafer 120 according to the embodiment includes the substrate 5, the first semiconductor layer 51, and the functional layer 10*s*. As described above, the sapphire substrate, the GaN substrate, the silicon substrate, or the like is used as the substrate 5. If the substrate 5 is the sapphire substrate or the silicon substrate, the foundation layer 52 is further included in the semiconductor wafer 120. The first semiconductor layer 51 is provided on the substrate 5. The light emitting layer 30 is arranged with the substrate 5 in the Z-axis direction. The first semiconductor layer 51 is provided between the substrate 5 and the light emitting layer 30. The foundation layer 52 is provided between the substrate 5 and the first semiconductor layer 51. As the first semiconductor layer 51, the foundation layer 52 and the functional layer 10*s*, those described in the first embodiment may be used. The semiconductor wafer 120 is used in manufacturing the semiconductor light emitting device 110. By this, the semiconductor light emitting device 110 with high luminous efficiency is provided.

Third Embodiment

Figure 12:
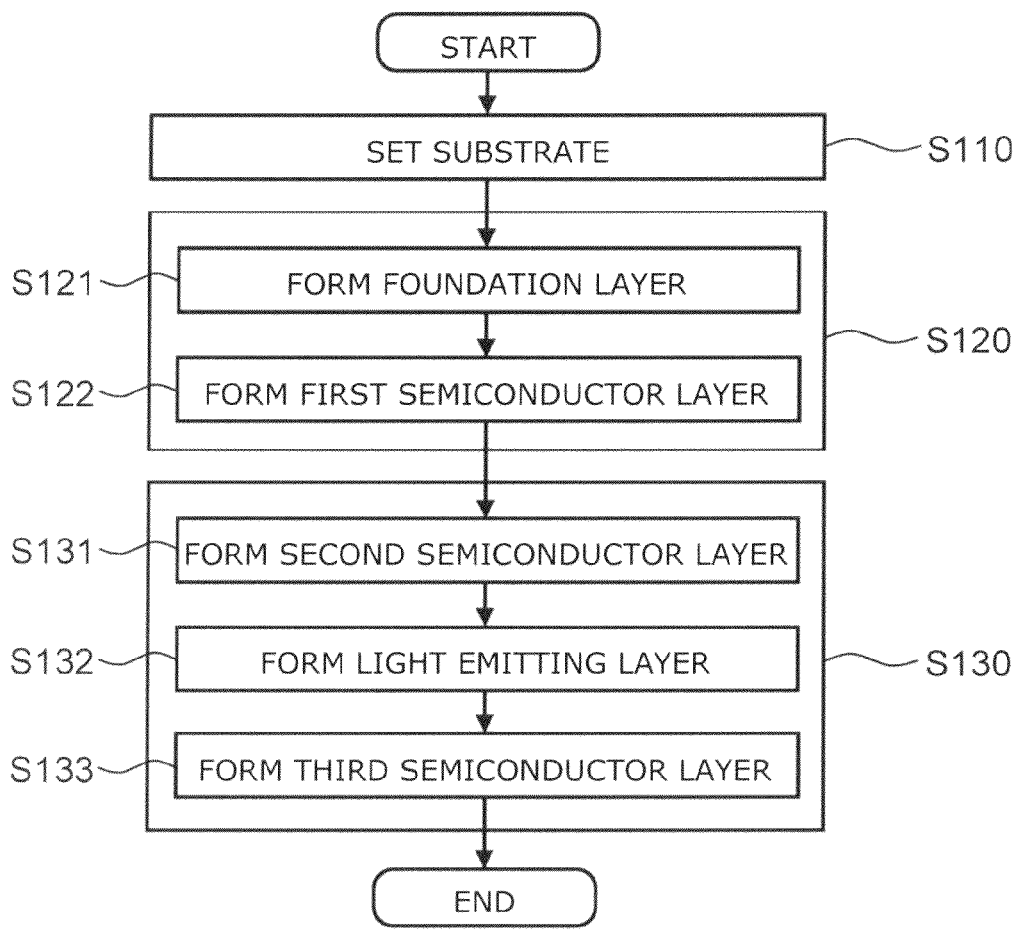
FIG. 12 is a flowchart showing a manufacturing method of a semiconductor light emitting device according to a third embodiment.

FIG. 12 is a flowchart showing a manufacturing method of a semiconductor light emitting device according to a third embodiment.

As shown in FIG. 12, the manufacturing method of the semiconductor light emitting device according to the embodiment includes step S110 for setting the substrate 5 in the reacting furnace 210 of the semiconductor manufacturing device 200, step S120 for forming the first semiconductor layer 51 on the substrate 5, and step S130 for forming the functional layer 10*s* on the first semiconductor layer 51.

Step S120 for forming the semiconductor layer 51 includes, for example, step S121 for forming the foundation layer 52 (or the foundation layer 52*s*) on the substrate 5 and step S122 for forming the first semiconductor layer 51 on the foundation layer 52.

Step S130 for forming the functional layer 10*s* includes, for example, step S131 for forming the second semiconductor layer 10 on the first semiconductor layer 51, step S132 for forming the light emitting layer 30 on the second semiconductor layer 10, and step S133 for forming the third semiconductor layer 20 on the light emitting layer 30. Note that step 140 for forming the functional layer 10s is sufficient as long as it at least includes steps for forming the light emitting layer 30 on the first semiconductor layer 51.

Furthermore, step S120 for forming the first semiconductor layer 51 includes supplying the carrier gas including nitrogen and hydrogen in the reacting furnace 210. Moreover, the mixing ratio of nitrogen in the carrier gas is set to be greater than the mixing ratio of hydrogen therein.

By this, the semiconductor light emitting device with high luminous efficiency is manufactured.

According to the embodiments, the semiconductor light emitting device with high luminous efficiency, the semiconductor wafer, and the manufacturing method of the semiconductor light emitting device are provided.

Note that in the specification, the term "nitride semiconductor" shall be understood to include semiconductors of all compositions wherein composition ratios a, b, and c are changed in respective ranges thereof in the formula $B_a In_b Al_c Ga_{1-a-b-c}N (0 \leq a \leq 1, 0 \leq b \leq 1, a+b+c \leq 1)$. Furthermore, with the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

Note that in the specification, "perpendicular" and "parallel" are not used to mean perpendicular and parallel in their narrowest sense, but rather substantially perpendicular or parallel so as to take factors into account such as variations in manufacturing processes and the like. In the specification, a state of being "provided on . . . side" includes a state of being provided with another element inserted in between in addition to a state of being provided in direct contact. In the specification, a state of being "provided on" includes a state of being provided with another element inserted in between in addition to the state of being provided in direct contact. A state of being "stacked" includes a state of being stacked with another element inserted in between in addition to a state of being stacked in contact with one another. A state of "opposing" includes a state of facing with another element inserted in between in addition to a state of directly facing. In the specification, being "connected electrically" includes being connected via another conductive material in addition being connected by direct contact.

The embodiments of the invention are described above while referring to the specific examples. However, the embodiments of the invention are not limited to the specific examples. For example, if a person with ordinary skill in the art to which the invention pertains selects as appropriate each element from the publicly known range for the specific configuration of the substrate, the foundation layer, the first semiconductor layer, the functional layer, the second semiconductor layer, the third semiconductor layer, the light emitting layer, the first portion, the second portion, the In-containing layer, the first intermediate layer, and the second intermediate layer and the like included in the semiconductor light emitting device and the semiconductor wafer, and implements the invention in the same way, it is included within the scope of the invention as long as the same effect can be obtained.

Additionally, combinations of elements from two or more of the examples are also included in the scope of the invention, provided that they are technically possible and do not depart from the spirit of the invention.

Beside such cases, all semiconductor light emitting devices, semiconductor wafers, and manufacturing methods of the semiconductor light emitting device based on the semiconductor light emitting device, the semiconductor wafer, and the manufacturing method of the semiconductor light emitting device described above as the embodiments of the invention that are obtainable through appropriate design modifications by a person skilled in the art shall be understood to fall within the scope of the invention provided such semiconductor light emitting devices, semiconductor wafers, and manufacturing methods of the semiconductor light emitting device do not depart from the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    a light emitting layer;
    a first semiconductor layer arranged with the light emitting layer in a first direction, the first semiconductor layer including a first portion and a second portion, the first portion and the second portion including a nitride semiconductor, the first portion having a first lattice polarity, and the second portion having a second lattice polarity different from the first lattice polarity;
    a second semiconductor layer provided between the first semiconductor layer and the light emitting layer, the second semiconductor layer being of a first conductivity type;
    a third semiconductor layer of the second conductivity type, the light emitting layer being provided between the second semiconductor layer and the third semiconductor layer; and
    an In-containing layer provided between the second semiconductor layer and the light emitting layer, the In-containing layer including a nitride semiconductor including In,
    the light emitting layer including a nitride semiconductor including In,
    a composition ratio of In in the In-containing layer being different from a composition ratio of In in the light emitting layer,
    a lattice length of the In-containing layer in an a-axis direction being not less than 0.1% greater than a lattice length of the second semiconductor layer in the a-axis direction, and
    a difference of the lattice length of the In-containing layer in the a-axis direction and the lattice length of the light emitting layer in the a-axis direction is not more than 0.1%.

2. The device according to claim 1, wherein the second lattice polarity is inverted relative to the first lattice polarity.

3. The device according to claim 2, wherein
    the first portion and the second portion include GaN,
    the first lattice polarity is a Ga polarity, and
    the second lattice polarity is an N polarity.

4. The device according to claim 1, wherein
the In-containing layer includes
a plurality of first intermediate layers including a nitride semiconductor including In, and
a plurality of second intermediate layers including the nitride semiconductor, and
each of the first intermediate layers and each of the second intermediate layers are alternately stacked in the first direction.

5. The device according to claim 4, wherein the composition ratio of In in each of the first intermediate layers is not less than 0.01 and not more than 0.2.

6. The device according to claim 5, wherein each of the first intermediate layers includes $In_qGa_{1-q}N(0<q<1)$.

7. The device according to claim 4, wherein a bandgap energy of each of the first intermediate layers is lower than a bandgap energy of each of the second intermediate layers.

8. The device according to claim 4, wherein
the light emitting layer includes a plurality of barrier layers and a plurality of well layers alternately stacked in the first direction,
a bandgap energy of each of the barrier layers is higher than a bandgap energy of each of the well layers, and
the bandgap energy of each of the first intermediate layers is higher than the bandgap energy of each of the well layers.

9. The device according to claim 8, wherein each of the well layers includes $In_xGa_{1-x}N(0<x<1)$.

10. The device according to claim 9, wherein the composition ratio of In in each of the first intermediate layers is lower than the composition ratio of In in each of the well layers.

11. The device according to claim 1, wherein the lattice length of the first semiconductor layer in the a-axis direction is not less than 0.3182 nm.

12. The device according to claim 1, further comprising:
a foundation layer including a nitride semiconductor,
the first semiconductor layer being provided between the foundation layer and the light emitting layer.

13. The device according to claim 1, wherein the first semiconductor layer has a plurality of second portions distributed in the first portion.

14. The device according to claim 13, wherein, in a plane perpendicular to the first direction, a percentage of the total area of the second portions relative to an area of the first semiconductor layer is not less than 0.1% and not more than 50%.

15. A semiconductor wafer, comprising:
a substrate;
a light emitting layer arranged with the substrate in a first direction;
a first semiconductor layer provided between the substrate and the light emitting layer, the first semiconductor layer including a first portion and a second portion, the first portion and the second portion including a nitride semiconductor, the first portion having a first lattice polarity, and the second portion having a second lattice polarity different from the first lattice polarity;
a second semiconductor layer provided between the first semiconductor layer and the light emitting layer, the second semiconductor layer being of a first conductivity type;
a third semiconductor layer of the second conductivity type, the light emitting layer being provided between the second semiconductor layer and the third semiconductor layer; and
an In-containing layer provided between the second semiconductor layer and die light emitting layer, the In-containing layer including a nitride semiconductor including In,
the light emitting layer including a nitride semiconductor including In,
a composition ratio of In in the In-containing layer being different from a composition ratio of In in the light emitting layer,
a lattice length of the In-containing layer in a-axis direction being not less than 0.1% greater than a lattice length of the second semiconductor layer in the a-axis direction, and
a difference of the lattice length of the In-containing layer in the a-axis direction and the lattice length of the light emitting layer in the a-axis direction is not more than 0.1%.

* * * * *